United States Patent [19]
Ceccherelli et al.

[11] Patent Number: 5,136,187
[45] Date of Patent: Aug. 4, 1992

[54] TEMPERATURE COMPENSATED COMMUNICATIONS BUS TERMINATOR

[75] Inventors: John C. Ceccherelli, Manassas; Stephen R. Scandalis, Warrenton, both of Va.

[73] Assignee: International Business Machines Corporation, Armonk, N.Y.

[21] Appl. No.: 691,942

[22] Filed: Apr. 26, 1991

[51] Int. Cl.⁵ .................. H03K 17/16; H03K 19/092
[52] U.S. Cl. ..................... 307/443; 307/475; 307/296.1
[58] Field of Search .............. 307/475, 296.1, 270, 307/443, 557, 558, 559, 560; 333/22 F

[56] References Cited

U.S. PATENT DOCUMENTS

| | | | |
|---|---|---|---|
| 3,283,259 | 1/1963 | Banks | 328/147 |
| 3,723,759 | 3/1973 | Giguere | 307/443 |
| 3,727,072 | 4/1973 | Madrazo et al. | 307/443 |
| 3,775,706 | 11/1973 | Jones et al. | 333/22 R |
| 3,832,575 | 8/1974 | Dasgupta et al. | 307/443 |
| 4,015,147 | 3/1977 | Davidson et al. | 307/304 |
| 4,220,876 | 9/1980 | Ray | 307/296.1 |
| 4,365,214 | 12/1982 | Shillady | 333/33 |
| 4,508,981 | 4/1985 | Dorler et al. | 307/542 |
| 4,675,551 | 6/1987 | Stevenson et al. | 307/443 |
| 4,853,560 | 8/1989 | Iwamura et al. | 307/475 |
| 4,890,271 | 12/1989 | Stohs | 369/24 |
| 4,943,739 | 7/1990 | Slaughter | 307/443 |
| 5,019,728 | 5/1991 | Sanwo et al. | 307/475 |

FOREIGN PATENT DOCUMENTS 63316920 12/1983 Japan.

OTHER PUBLICATIONS

"Analysis and Design of Digital Integrated Circuits", 1983, McGraw-Hill, Hodges et al., pp. 158-161.
M. Cases, et al., "Multifunctional Diode Terminator Network", vol. 21, No. 5, IBM TDB, Oct. 1978, pp. 1881-1882.
A. Barish, et al., "Active Terminator", IBM TDB, vol. 17, No. 7, Dec. 1974, p. 1960.
W. R. Dachtera, "Schottky Diode Line Terminator", vol. 12, No. 11, Apr. 1960, p. 1861.
J. Bode, et al, "Dynamic Active Terminator Circuit", IBM TDB, vol. 19, No. 10, Mar. 1977, p. 3745.
Y. Gopalakrishna, et al., "Ground-Up Low-Power Bipolar Circuit", IBM TDB, vol. 17, No. 1, Jun. 1974, pp. 111-112.
J. Palmieri, et al., "Nonlinear Termination Network for a Transmission Line Semiconductor Circuit", IBM TDB, vol. 12, No. 11, Apr. 1970, p. 1762.

Primary Examiner—Edward P. Westin
Assistant Examiner—Richard Roseen
Attorney, Agent, or Firm—Mark A. Wurm

[57] ABSTRACT

A system and method of providing a temperature compensated line termination for a high speed communications bus meeting military standards specifications. A temperature compensating device exhibiting a negative temperature coefficient of resistance is connected between a power supply and the communications bus drives. In a preferred embodiment, a P-N junction in series with a Schottky diode is placed between a 3.3 volt supply and the communications bus drive modules.

8 Claims, 2 Drawing Sheets

TEMPERATURE COMPENSATED COMMUNICATIONS BUS TERMINATOR

This invention was made with Government support under contract number N62269-89-C-0501 awarded by the Department of the Navy. The Government has certain rights in this invention.

BACKGROUND OF THE INVENTION

1. Technical Field

The invention disclosed broadly relates to line terminators for communication buses and more particularly relates to compensated line termination for communication buses meeting military standard specifications.

2. Background Art

In digital communications systems, more than one device driver can be asserting the bus at any given time. This causes the termination current to the line to be shared by one or more device drivers. If one device driver releases a line while another remains on, a current pulse is sent on the line. The on driver eventually sinks the additional current, but as a result, a current pulse is produced. As a result of the current pulse, a voltage pulse or wired-OR-glitch (WOG) develops. This glitch can cross a receiver threshold and change the digital signal on the bus from a zero to a one or vice-versa.

In the military avionics communications systems employing PIBUS or in the commercial setting, Futurebus, the voltage of the WOG can be significantly different over the specified operational temperature range. To receive valid data, the bus cannot be interrogated until the WOG dissipates. In a high speed data communications system, this time can be significantly long on the order of 20 or more nanoseconds. This severely limits the data transfer rate of the communications system.

The PIBUS or Futurebus has a standard requiring a two volt supply on the termination resistance. This two volt supply is an extra supply that must be provided to drive the communication bus interface modules and must deliver somewhere in the neighborhood of 20-40 amps. This supply takes up weight, space and reduces the overall efficiency of the system. Where space, weight and efficiency are important, such as in military and commercial aircraft, such a power supply is expensive in terms of cost, weight, reliability and maintenance.

OBJECTS OF THE INVENTION

It is therefore an object of the invention to provide an improved bus termination scheme that is temperature compensated over the full range military temperature specification.

It is another object of the invention to provide a line termination scheme whereby reduced settling time is achieved.

It is still another object of the invention to provide an improved line termination scheme eliminating the need for additional power supplies.

SUMMARY OF THE INVENTION

The present invention is a system and method of providing a high speed communications bus employing line termination that is temperature compensated over the full military temperature range of −55 degrees C. to 125 degrees C., producing reduced settling times and eliminating the need for additional power supplies. A temperature compensating device exhibiting the characteristics of a negative temperature coefficient of resistance is connected between a power supply and the communication bus drive modules to produce compensated current and voltage values consistent with the specifications of the communications bus. In a preferred embodiment, a P-N junction in series with a Schottky diode is placed between a 3.3 volt supply and the communications bus drive modules.

DETAILED DESCRIPTION OF THE INVENTION

Figure 1A:
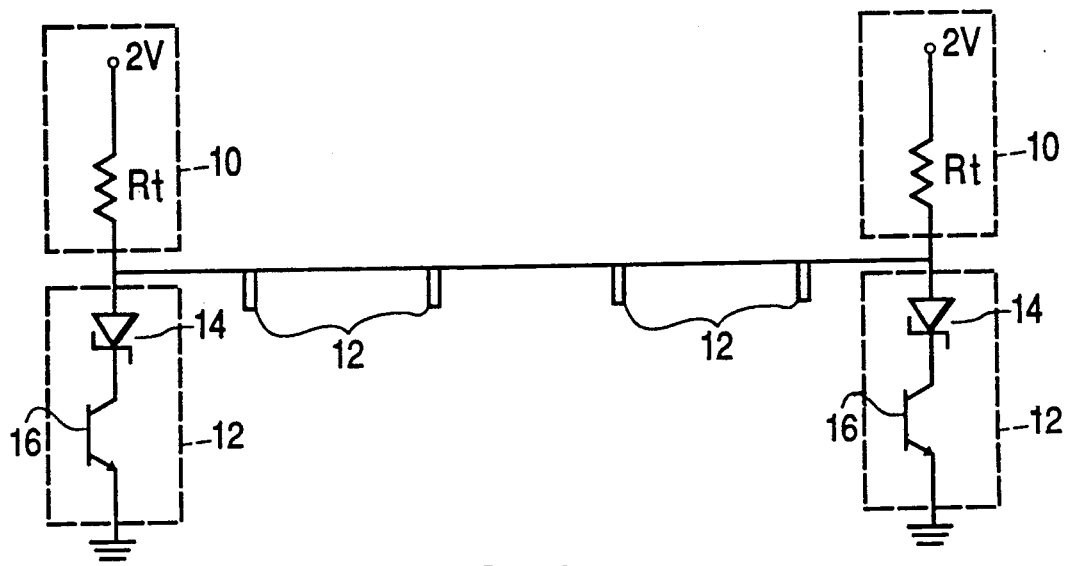
FIG. 1A is a sketch of a typical communications bus employed in PIBUS.

Shown in FIG. 1A is a typical communications bus such as a PIBUS or Futurebus. Connected to each end of the terminating line is a two volt power supply and a termination resistance. The termination resistance Rt 10 is typically the characteristic impedance, ZO, that matches the impedance of the communications bus. The communications bus is shown to have six drivers 12 which are represented by a Schottky diode 14 and a transistor 16. These drivers assert control over the line by turning on and pulling the line down to approximately one volt. This line state is typically considered a logical one. If one or more drivers are on, the line is in the logical one state. When two or more drivers are on, and one turns off, its share of termination current must be taken by the other on driver. This current transient produces the WOG. The glitch duration and voltage is dependent on driver location on the line and the number of drivers asserting the line. The worst case WOG occurs when two drivers are initially on at the far ends of the line. When all drivers are off, the termination resistors pull the line to Vt and the line is in a logical zero state. The logic swing established for the PIBUS communications system is a transition from two volts representing a logical zero to one volt representing a logical one. The threshold for this transition is deemed to be 1.5 volts.

Figure 1B:
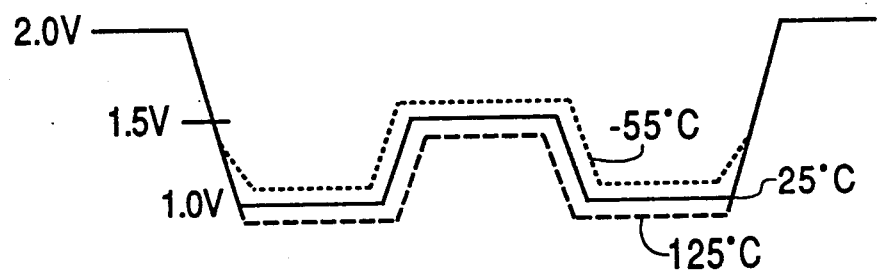
FIG. 1B is a drawing showing the threshold voltage of various temperatures at the extremes of the military specification as well as room temperature.

Shown in FIG. 1B is a typical voltage swing at room temperature, the WOG is less than 1.5 volts. At 125 degrees C., the WOG achieves a voltage somewhat lower than 1.5 and the drive circuit pulls the line lower than a one volt operating level. This does not cause problems in the communications bus. At −55 degrees C, the voltage drop across the Schottky diode and transistor of the driver is higher. As a result, the output driver cannot pull the line as low as it does at 25C or 125C. At −55C, the WOG starts from a higher voltage level and the maximum voltage of the WOG now exceeds the 1.5 volt switching threshold. The voltage and duration of the WOG at lower temperatures is sufficient to be interpreted by a receiver as a logical zero. Over this wide temperature range of −55 degrees C. to 125 degrees C., temperature compensation needs to be made to the termination circuit. In the past, open collector (wired or) busses were not used in high speed communication applications.

Figure 2:
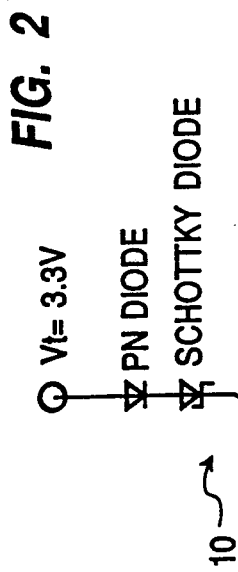
FIG. 2 is a schematic of the preferred embodiment of the present invention.

To overcome the variability of the WOG over the wide operating temperature range, the present invention replaces the terminator resistance 10 of the communications bus. Instead of a simple resistive terminator, a temperature compensated termination is used. As shown in FIG. 2 a 3.3 volt power supply, which presently exists in 0.5 micron VLSI circuits, is used. This driving voltage is dropped through a P-N junction in series with a Schottky diode giving a 1.1 to 1.33 volt decrease in the supply voltage. A P-N diode is connected in series with the 3.3 volt power supply. The other end of the P-N diode is connected in series to a Schottky diode which connects to a terminator resistor. The P-N diode, Schottky diode and terminator resistor provide the impedance matched line termination for a digital communications bus. This P-N junction and Schottky diode drop is temperature dependent. As temperature decreases, the voltage drop of the diodes increases. This has the effect of reducing the current supplied by the termination circuit. At −55C the line requires less pull up current since it is starting from higher voltage. It has been determined that a 36 ohm resistor, Rt, provides the best case results on the PIBUS communications bus. The invention is technology independent and can be made of FET or bipolar devices as well as resistive material having a negative temperature coefficent of resistance (TCR).

Figure 3:
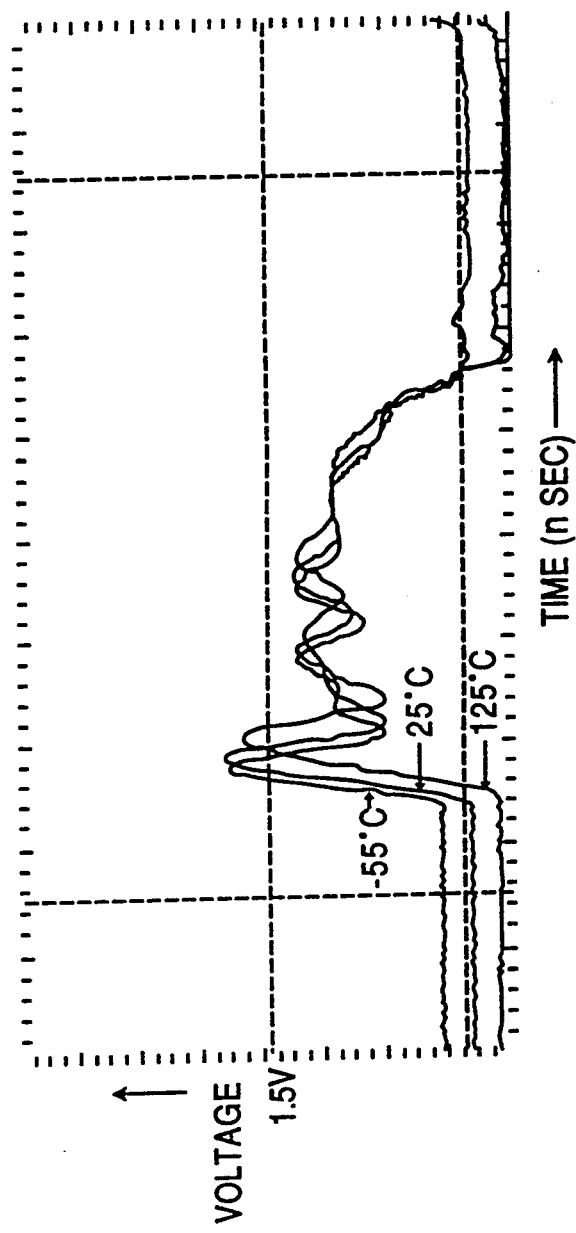
FIG. 3 is a plot of the signal response over the military temperature range for a transition from one to zero on the PIBUS.

Shown in FIG. 3 is the WOG voltage for −55 degrees C., 25 degrees C. and 125 degrees C. As can be seen using the invention, all three temperatures produce a nearly identical WOG voltage. The short duration voltage spikes above 1.5 volts are ignored by use of an integrator circuit which disregards pulse widths of less than about four nanoseconds.

What is described is a wired-OR temperature compensated line terminator meeting the full temperature range of the military specifications having reduced settling time and the elimination of a power supply.

Although a specific embodiment of the invention has been disclosed, it will be understood by those having skill in the art that changes can be made to the specific embodiment without departing from the spirit and the scope of the invention.

What is claimed is:

1. A line termination arrangement for a communications bus having a plurality of communication drive modules connected thereto comprising a negative temperature coefficient compensating resistance comprised of a resistor, a P-N diode and a Schottky diode serially connected between a power supply and the communication drive modules for providing proper line termination for the communication bus over a wide temperature range.

2. The line termination arrangement of claim 1 wherein temperature compensation is provided over a range of −55° C. to 125° C.

3. The line termination of claim 1 wherein the power supply is approximately 3.3 volts.

4. The line termination of claim 2 wherein the resistor has a value of 36 ohms.

5. A communications bus having a plurality of communication drive modules connected thereto comprising a negative temperature coefficient resistance compensated line termination comprising a resistor, a P-N diode and a Schottky diode serially connected between a power supply and the communication drive modules.

6. The communication bus of claim 5 wherein the resistor has a value of 36 Ohms.

7. The communication bus of claim 5 wherein temperature compensation is provided over a range of −55° C. to 125° C.

8. A high speed communications bus having a plurality of communications drive modules connected thereto comprising a resistor, a P-N diode and a Schottky diode connected in series between a 3.3 bolt supply and the communications drive modules for providing temperature compensated termination resistance over a temperature range of −55° C. to 125° C.

* * * * *